(12) United States Patent
Hernes

(10) Patent No.: US 8,786,475 B2
(45) Date of Patent: Jul. 22, 2014

(54) INPUT CONFIGURATION FOR ANALOG TO DIGITAL CONVERTER

(75) Inventor: Bjornar Hernes, Trondheim (NO)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 13/498,513

(22) PCT Filed: Aug. 28, 2010

(86) PCT No.: PCT/IB2010/002307
§ 371 (c)(1),
(2), (4) Date: Aug. 7, 2012

(87) PCT Pub. No.: WO2011/036529
PCT Pub. Date: Mar. 31, 2011

(65) Prior Publication Data
US 2012/0313668 A1 Dec. 13, 2012

Related U.S. Application Data

(60) Provisional application No. 61/246,213, filed on Sep. 28, 2009.

(51) Int. Cl.
*H03M 1/00* (2006.01)
(52) U.S. Cl.
USPC ............... 341/122; 327/91; 327/94; 327/124; 327/157; 327/337; 455/313; 330/253; 330/257
(58) Field of Classification Search
USPC .......... 341/122; 327/91, 94, 95, 96, 124, 155, 327/157, 337, 557; 455/313; 330/253, 257
See application file for complete search history.

(56) References Cited

U.S. PATENT DOCUMENTS

| 6,275,076 | B1 * | 8/2001 | Simony | 327/94 |
| 6,377,195 | B1 * | 4/2002 | Eklund et al. | 341/118 |
| 6,452,424 | B1 * | 9/2002 | Shamlou et al. | 327/91 |
| 6,518,903 | B1 * | 2/2003 | Perraud et al. | 341/143 |
| 6,661,283 | B1 * | 12/2003 | Lee | 327/124 |

(Continued)

FOREIGN PATENT DOCUMENTS

EP 0281155 A2 9/1988

OTHER PUBLICATIONS

Yotsuyanagi, et al., "A 10-B 50-MHZ 2-6 Pipelined CMOS A/D Converter With S/H", IEEE Journal of Solid-State Circuits, IEEE Service Center, Piscataway, NJ, USA, vol. 28, No. 3, Mar. 1, 1993, pp. 292-300, XP000363929, ISSN: 0018-9200, DOI: 001:10.1109/4.209996 section I I; figures 1, 3, 5.

(Continued)

*Primary Examiner* — Lam T Mai
(74) *Attorney, Agent, or Firm* — Rajesh Vallabh; Foley Hoag LLP

(57) ABSTRACT

A circuit includes an input, two or more sampling capacitors each in a different channel, means for connecting each sampling capacitor to the input, means for discharging the sampling capacitors to a given voltage in a reset phase, and means to use the voltage across the sampling capacitor for further processing in a hold phase. The two sampling capacitors operate in anti-phase such that the reset phase and sampling phase of one channel are performed in the time period the other channel is in the hold phase.

13 Claims, 3 Drawing Sheets

(56) References Cited

U.S. PATENT DOCUMENTS

| | | | |
|---|---|---|---|
| 7,015,729 B1 * | 3/2006 | Tursi et al. | 327/94 |
| 7,025,245 B2 * | 4/2006 | Gust | 228/107 |
| 7,053,673 B1 * | 5/2006 | Yuan | 327/91 |
| 7,724,042 B2 * | 5/2010 | Mathur et al. | 327/94 |
| 7,791,380 B2 * | 9/2010 | Bramante et al. | 327/94 |
| 7,834,786 B2 * | 11/2010 | Kawahito et al. | 327/94 |
| 7,924,062 B2 * | 4/2011 | Chiu | 327/94 |
| 2013/0162455 A1 * | 6/2013 | Mateman | 341/122 |

OTHER PUBLICATIONS

International Search Report and Written Opinion for PCT/IB2010/002307, dated Jun. 9, 2011.

* cited by examiner

INPUT CONFIGURATION FOR ANALOG TO DIGITAL CONVERTER

This application claims priority to U.S. Provisional Application Ser. No. 61/246,213 filed on Sep. 28, 2009.

BACKGROUND

1. Technical Field

Analog to digital converters (ADC) are disclosed and, more specifically, configurations and timings of the input stages of ADCs are disclosed.

2. Description of the Related Art

In all ADC architectures, an input signal is sampled at defined timed intervals and converted into a time discrete representation with finite resolution. This function consists of two operations called sampling and quantization. In the sampling operation, the input signal is sampled at a defined point in time, and the value of the input signal for that point in time is stored for further processing. The sampling operation is very critical as all errors introduced limit the accuracy that can be obtained for the total system.

For many ADC architectures like pipelined ADCs and successive approximation ADCs, the input signal is sampled at the input stage of the ADC while the quantization function is distributed across the complete converter.

The sampling function is very often performed by dedicated circuitry called sample-and-hold (SHA) or track-and-hold (THA) amplifiers in order to optimize performance. However, such functions tend to consume a significant amount of power since the requirement to performance in this first block is high.

In order to simplify the system and reduce power dissipation, several solutions exist to combine the SHA with the input stage of the ADC itself. The following description assumes a pipelined ADC implemented with a switched capacitor technique, even though the solutions will be applicable for other ADC architectures, stand alone THAs and SHAs as well.

An explanation of the principle of a sampling switch can be found in FIG. 1. The sampling block usually consists of a capacitor 100 that is connected to the input signal during part of clock period and disconnected from the input signal during the rest of the period. The clock signal controls the switch 101. During the high phase, S, of the clock signal, the switch is closed and the input is connected to the sampling capacitor 100. At the high to low transition of the clock signal, the switch is opened and the value of the input signal at that point in time is stored on the capacitor until the next time the switch is closed.

An implementation of such a principle consists of significantly more circuitry even though the basic operation of a sampling switch always follows the principle shown in FIG. 1. In solutions where the SHA is combined with other circuitry inside the ADC, the charge on the capacitor is often changed during the hold period, H. In this period the stored value of the input signal is used for further processing to perform the quantization.

A common problem in sampling switches in general, and in particular in the situations where the charge stored on the capacitor is changed, is the kick-back into the input network that arises when the switch 101 is closed again for a new sampling period. Assuming a dynamic input signal to the sampling switch, the voltage across the capacitor will be equal to the input signal at the falling edge of the clock signal. During the hold phase, the voltage across the capacitor will be kept unchanged, or it will be altered by other circuitry. The input signal will during the same period change to a different value. When the switch is closed again, a transient current will be pulled from the input signal in order to charge the capacitor. This transient current represents noise that is kicked back into the input signal source. The ability of the input signal source to supply the required current to charge the sampling capacitor, and the speed that can be obtained in this process, determines the accuracy in the sample and hold process.

Two major solutions have been used in previous art to reduce the requirements to the input signal driver.

One solution consists of adding a buffer amplifier on-chip right before the sampling switch. This buffer amplifier is designed with sufficient speed to charge the sampling capacitor to the required accuracy in the available time. The kickback from the capacitor will then be attenuated by this buffer, and the input signal driver will therefore not be exposed to the large transient currents. This solution is not optimum from a noise perspective due to the extra buffer added into the signal path. This buffer will increase the total noise, increase power dissipation, and hence reduce the performance of the system.

Another solution consists of resetting the charge on the capacitor to a fixed value before each time the capacitor is connected to the input signal. This will not remove the transient current kick-back into the input signal source. But as the kick-back is equal for each clock period, it can be shown that the resulting errors are less visible in the ADC output spectrum, and reduced requirements to the input signal source can be accepted.

In order to allow for the resetting function, an extra phase must be introduced into the timing sequence of the SHA. FIG. 2 shows the principle and the timing required to perform such a resetting function.

An extra switch 102 is added to discharge the sampling capacitor prior to each sampling period. This switch is closed when the reset waveform shows a high value. The sequence of operation is as follows.

The switches 101 and 102 are open in the hold phase, and the voltage across the capacitor is used by other circuitry for further processing. This further processing operation must be finished before the reset signal goes high and the reset Switch 102 is closed discharging the sampling capacitor to zero voltage. The switch 102 is then opened while 101 is closed and the sampling capacitor is charged to the voltage of the input signal. The input voltage is then sampled and held across the sampling capacitor at the time the clock signal goes low and switch 101 is opened again. The sampling capacitor could be charged to a different potential than zero voltage. But in practice it is common to discharge it to obtain a voltage as close to zero as possible at the beginning of the sampling period.

The major disadvantage with this kind of resetting scheme is that the total time available for the sampling and hold periods is reduced since a third phase is introduced into the timing sequence. Typically, the reset phase is made at the cost of a shorter sampling phase while the hold phase is kept unchanged. This is still challenging to make work in practice since the total time for reset and sampling becomes short. A short sampling time would require higher driving strength in the external amplifier driving the input signal. This would increase the power dissipation of this amplifier. A shorter hold period would require higher speed, and hence increased power dissipation, in the sensing circuitry used for further processing of the sampled voltage.

SUMMARY OF THE DISCLOSURE

The SHA disclosed herein contains an input, two or more sampling capacitors, means for connecting each sampling capacitor to said input, means for discharging the sampling capacitors to a given voltage in a reset phase, means to use the voltage across the sampling capacitor for further processing in a hold phase, operating the two sampling capacitors in anti-phase such that the reset phase and sampling phase of one channel are performed in the time period the other channel is in hold phase.

In a refinement, a disclosed circuit comprises an input, at least two sampling capacitors arranged in at least two different channels, each sampling capacitor being coupled to the input when in a sampling phase. The sampling capacitors each having a reset phase to provide a given voltage received by the input during the sampling phase, a hold phase for further processing of the given voltage, and an anti-phase where the reset phase and sampling phase of one channel are performed when the reset phase and sampling phase of the other channel are in a hold phase or idle.

In a refinement, the circuit comprises a first stage of a pipelined ADC.

In another refinement, the circuit comprises part of a sample-and-hold amplifier or a track-and-hold amplifier.

In another refinement, the circuit comprises part of an input stage of an ADC.

In another refinement, the circuit comprises a differential configuration.

Other advantages and features will be apparent from the following detailed description when read in conjunction with the attached drawings.

BRIEF DESCRIPTION OF THE DRAWINGS

For a more complete understanding of the disclosed methods and apparatuses, reference should be made to the embodiments illustrated in greater detail in the accompanying drawings, wherein.

It should be understood that the drawings are not necessarily to scale and that the disclosed embodiments are sometimes illustrated diagrammatically and in partial views. In certain instances, details which are not necessary for an understanding of the disclosed methods and apparatuses or which render other details difficult to perceive may have been omitted. It should be understood, of course, that this disclosure is not limited to the particular embodiments illustrated herein.

DETAILED DESCRIPTION OF THE PRESENTLY PREFERRED EMBODIMENTS

A disclosed scheme used to introduce a reset phase into a sampling network without reducing the total available time for the sampling and hold phases.

Figure 3:
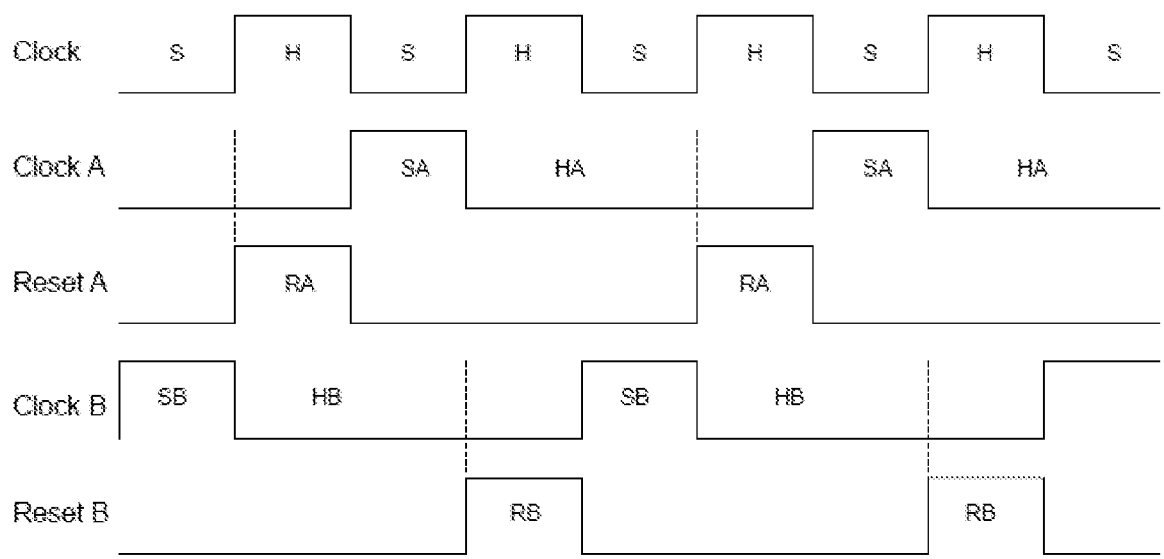
FIG. 3 shows an illustration of a disclosed embodiment.
Figure 3:
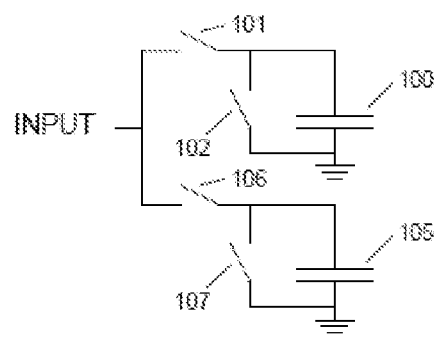

FIG. 3 shows an illustration of the invented scheme that can be used to avoid reducing the total available time for the sampling and hold phases. Another advantage with the scheme is that the time for the hold phase is doubled. The available time for the hold phase directly determines the required speed and power dissipation of the circuitry used to post process the sampled voltage. Hence, the invented scheme reduces power dissipation of the internal circuitry. At the same time the requirements to the external amplifier is reduced since the introduction of the reset phase does not require reducing the length of the sampling phase.

Figure 1:
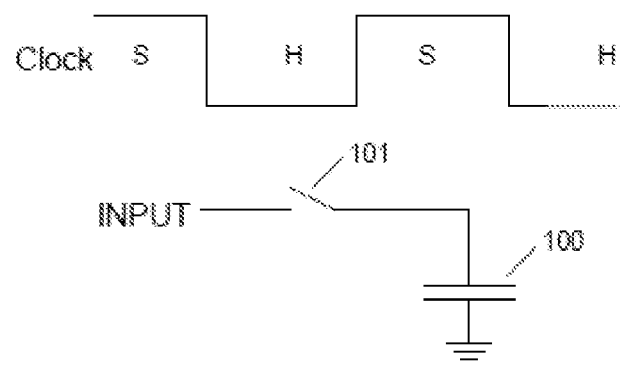
FIG. 1 shows an illustration of a switched capacitor sample-and-hold circuit in accordance with the prior art.
Figure 2:
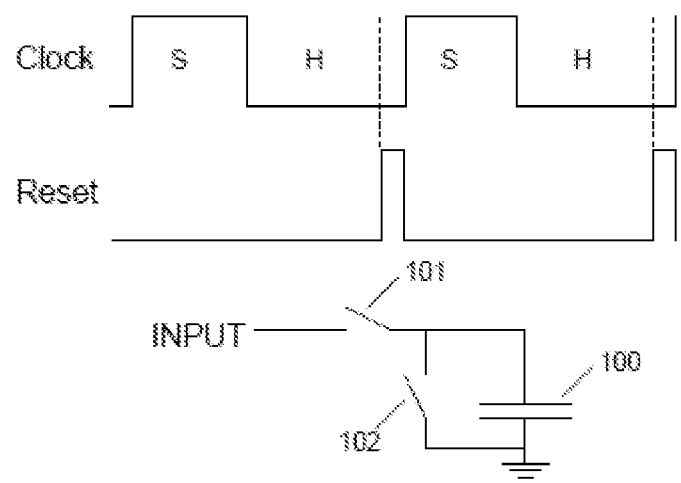
FIG. 2 shows an illustration of a prior art switched capacitor sample-and-hold circuit where a reset switch is added in order to discharge the sampling capacitor prior to each sampling phase and which shows a single ended implementation for easier understanding even if actual implementations would be differential.

The operation of the circuit is as follows:

The single sampling capacitor shown in FIGS. 1 and 2 is in FIG. 3 replaced with two parallel capacitors 100 and 105. The input switches 101 and 106 and reset switches 102 and 107 also have two instantiations as shown in FIG. 3. The waveforms represent the operation of the switches with time on the x-axis. A switch is closed when the waveform is high and open when the waveform is low. Clock A controls the switch 101, reset A controls switch 102, clock B controls switch 106 and reset B controls switch 107.

Starting from the point in time represented by the left side of the waveforms, switch 101 and 102 are open. Switch 102 is then closed resetting the sampling capacitor of channel A.

At the next clock edge, switch 102 is opened and switch 101 is closed connecting the sampling capacitor of channel A 100 to the input signal, starting the sampling period for channel A, labeled SA.

At the next clock edge, switch 101 is opened again, and the input voltage is stored on the sampling capacitor of channel A 100. This period is labeled HA. At the same time switch 107 is closed resetting the sampling capacitor of channel B.

At the next clock edge, channel A is still in the hold phase. Switch 107 is opened again and switch 106 is closed connecting the sampling capacitor of channel B 105 to the input signal, starting the sampling period for channel B, labeled SB.

At the next clock edge the hold period of channel A, HA, is finished and the reset phase of channel A starts, repeating the operation from the start. Switch 106 is opened again and the input voltage is stored on the sampling capacitor of channel B, 105, starting the hold period of channel B, HB By comparison to the ordinary sampling structures shown in FIGS. 1 and 2, one can see that the hold phases are twice as long in the disclosed SHA. This can be used to reduce power dissipation in the circuitry used for further processing of the sampled voltages. Since the hold phases of channel A and channel B do not overlap it is possible to use one single amplifier connected to both of the sampling capacitors 100 and 105 to post-process the sampled voltages. In this case special circuitry must be added in order to switch the amplifier between the sampling capacitors at suitable points in time, and to ensure that this operation does not disturb any of the two channels.

It can also be seen that the sampling phases SA and SB have the same duration in the disclosed SHA as in the previous art solution of FIG. 1. In addition, the reset phases RA and RB are significantly longer than in the previous art solution in FIG. 2. This makes it easier to implement the reset function with good performance and without significant drawbacks for normal operation as the available time to perform reset is longer.

Figure 4:
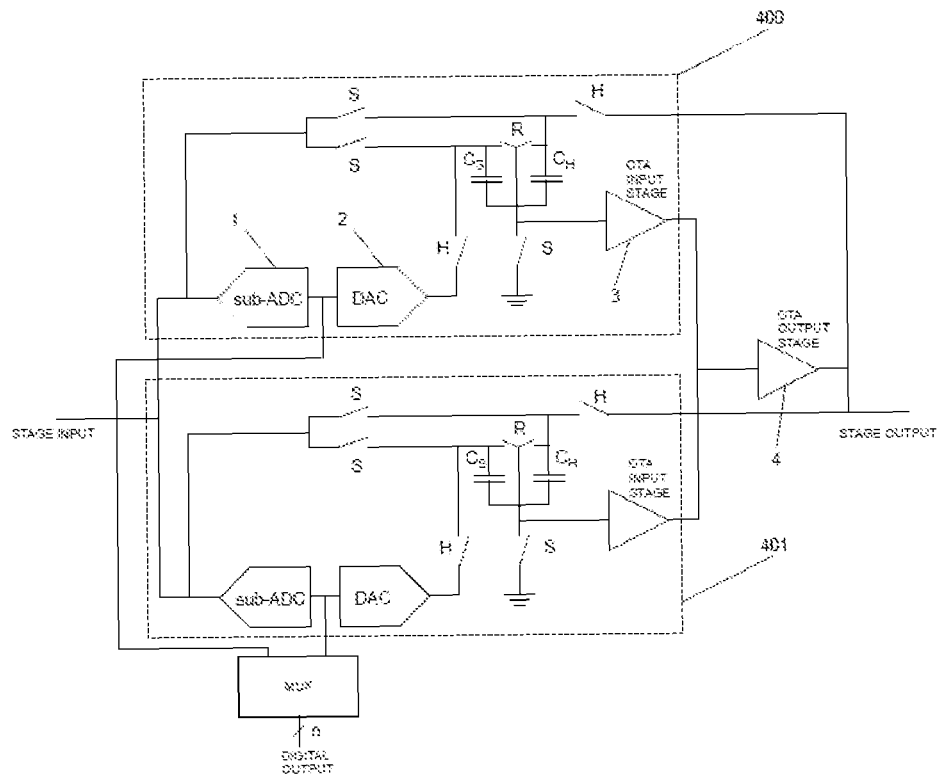
FIG. 4 shows a block diagram of the disclosed principle implemented into a pipeline ADC stage.

The disclosed SHA principle can as an example be used in a stage in a pipelined analog to digital converter. FIG. 4 shows an example of such use.

Figure 5:
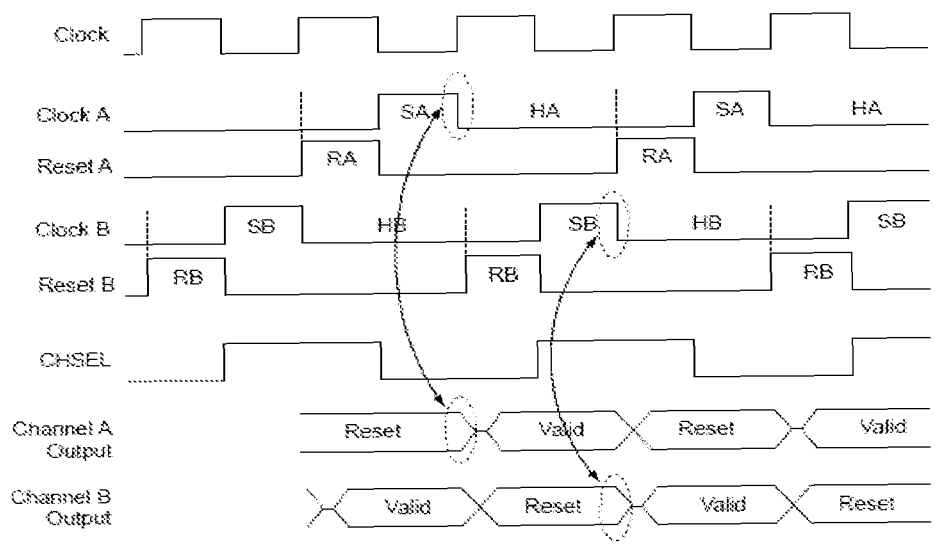
FIG. 5 shows the timing diagram corresponding to FIG. 4.

FIG. 4 shows a diagram of an example of a single pipeline stage implementing the disclosed SHA principle. FIG. 5 shows the corresponding timing diagram for the operation of the pipeline stage.

The ADC consists of two parallel channels implemented in each pipeline stage. The input to the two channels are shorted such that the same signal is propagated through each channel.

Alternatively the two channels could be kept separate, implementing two parallel independent channels. The channels work in anti-phase such that one channel is in hold mode when the other channel is in sampling mode. The operation of the pipeline stage is as follows.

The input signal to the stage is applied to two channels, 400 and 401. The waveforms in FIG. 5 labeled clock A corresponds to channel A, 400, and the waveforms labeled clock B corresponds to channel B, 401. Assume that channel 400 starts in the sampling phase and channel 401 is in hold-mode. The input signal is applied to the sub-ADC of channel 400 in parallel to the sampling network. The sub-ADC quantizes the input signal and outputs N bits at the end of the sampling phase. These N bits are converted back to an analog voltage by the DAC, 2, to be used in the hold-phase. During the sampling phase all switches labeled "S" are closed. These switches are opened at the end of the sampling phase sampling the input voltage on the sampling capacitors $C_S$ and $C_H$. In the hold phase, the switches labeled "H" are closed. This closes the loop around the amplifier comprising of the OTA input stage (3) and the OTA output stage 4, and the input voltage is amplified and held on the stage output terminal The DAC output voltage is also subtracted from the output through the capacitive feedback network of $C_S$ and $C_H$. This functionality is exactly equal to an ordinary pipeline stage.

While channel 400 has been in the sampling phase, channel 401 has been in hold-phase. At the end of the hold phase, the switches labeled "H" are opened and the reset switches labeled "R" are closed. The sampling capacitors are discharged. At the next phase, the reset switches labeled "R" are opened and the sampling switches labeled "S" are closed starting the sampling phase again. When the two channels switch the phase, the OTA output stage, 4, switches operation from one channel to the other. Therefore the OTA output stage is active 100% of the time while it is idle during the sampling phase of an ordinary pipeline stage. In FIG. 4 the OTA input stage will be idle during the sampling phase of their respective channel. However, in a typical implementation the majority of the current is flowing in the OTA output stage. Hence, there is significant savings in power dissipation in the amplifier by sharing it between two sub-channels.

The CHSEL, channel A output and channel B output show timing and availability of the output signals from the stage. These signals will be required to operate the stage in a pipelined ADC.

Although the forgoing text sets forth a detailed description of numerous different embodiments of the invention, it should be understood that the scope of the invention is defined by the words of the claims set forth at the end of this patent. The detailed description is to be construed as exemplary only and does not describe every possible embodiment of the invention because describing every possible embodiment would be impractical, if not impossible. Numerous alternative embodiments could be implemented, using either current technology or technology developed after the filing date of this patent, which would still fall within the scope of the claims defining the invention.

While only certain embodiments have been set forth, alternatives and modifications will be apparent from the above description to those skilled in the art. These and other alternatives are considered equivalents and within the spirit and scope of this disclosure and the appended claims.

The invention claimed is:

1. A circuit comprising:
   an input;
   at least two sampling capacitors arranged in at least two different channels, each sampling capacitor being coupled to the input when in a sampling phase for storing a value of an input signal,
   the sampling capacitors each having a reset phase to provide a given voltage to the sampling capacitor prior to the sampling phase, and each sampling capacitor having a hold phase following the sampling phase for further processing of the stored value of the input signal, and wherein the sampling capacitors operate in anti-phase to each other such that the reset phase and sampling phase of one channel are performed when the other channel is in a hold phase or idle.

2. The circuit according to claim 1 wherein the circuit comprises a first stage of a pipelined ADC.

3. The circuit according to claim 1 wherein the circuit comprises part of a sample-and-hold amplifier.

4. The circuit according to claim 1 wherein the circuit comprises part of a track-and-hold amplifier.

5. The circuit according to claim 1 wherein the circuit comprises part of an input stage of an ADC.

6. The circuit according to claim 1 further comprising a differential configuration.

7. A circuit comprising:
   an input;
   at least two sampling capacitors arranged in two different channels, the sampling capacitors coupled to the input in a sampling phase for storing a value of an input signal;
   the sampling capacitors also having a reset phase to provide a given voltage to the sampling capacitor prior to the sampling phase, and the sampling capacitors having a hold phase following the sampling phase for further processing of the stored value of the input signal; and
   an amplifier comprising one input stage per sampling capacitor and a common output stage, wherein the sampling capacitors anti-phase with respect to each other such that the reset phase and sampling phase of one channel are performed when the other channel is in a hold phase or idle.

8. The circuit according to claim 7 wherein the circuit comprises a first stage of a pipelined ADC.

9. The circuit according to claim 7 where the circuit comprises part of a sample-and-hold amplifier.

10. The circuit according to claim 7 where the circuit comprises part of a track-and-hold amplifier.

11. The circuit according to claim 7 wherein the circuit comprises part of an input stage of an ADC.

12. The circuit according to claim 7 further comprising a differential configuration.

13. A method of processing an input signal in a circuit comprising an input and two sampling capacitors, each arranged in a separate channel, the method comprising:
   (a) discharging each sampling capacitor to a given voltage in a reset phase;
   (b) connecting each sampling capacitor to the input and storing a value of the input signal at the sampling capacitor in a sampling phase following the reset phase;
   (c) processing the stored value of the input signal in a hold phase after the sampling phase; and
   (d) repeating steps (a) through (c) a plurality of times;
   wherein the sampling capacitors anti-phase with respect to each other such that the reset phase and sampling phase of one channel occur when the other channel is in a hold phase or idle.

* * * * *